United States Patent
Cheng et al.

(10) Patent No.: US 11,949,040 B2
(45) Date of Patent: *Apr. 2, 2024

(54) METHODS FOR MANUFACTURING SEMICONDUCTOR DEVICE

(71) Applicant: InnoLux Corporation, Miao-Li County (TW)

(72) Inventors: Kai Cheng, Miao-Li County (TW); Tsau-Hua Hsieh, Miao-Li County (TW); Fang-Ying Lin, Miao-Li County (TW); Tung-Kai Liu, Miao-Li County (TW); Hui-Chieh Wang, Miao-Li County (TW); Chun-Hsien Lin, Miao-Li County (TW); Jui-Feng Ko, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/725,732

(22) Filed: Apr. 21, 2022

(65) Prior Publication Data
US 2022/0246790 A1    Aug. 4, 2022

Related U.S. Application Data

(60) Continuation of application No. 16/858,826, filed on Apr. 27, 2020, now Pat. No. 11,335,827, which is a
(Continued)

(30) Foreign Application Priority Data

Mar. 5, 2018 (CN) .......................... 201810178352.4

(51) Int. Cl.
*H01L 33/00* (2010.01)
*H01L 33/62* (2010.01)
(Continued)

(52) U.S. Cl.
CPC ...... *H01L 33/0093* (2020.05); *H01L 33/0095* (2013.01); *H01L 33/62* (2013.01);
(Continued)

(58) Field of Classification Search
CPC . H01L 33/0093; H01L 33/0095; H01L 33/62; H01L 25/0753; H01L 25/167;
(Continued)

(56) References Cited

U.S. PATENT DOCUMENTS 7,164,151 B2 * 1/2007 Yamazaki ............ H10K 59/123
257/E27.111
9,691,948 B2 * 6/2017 Lin ..................... H01L 33/0095
(Continued)

*Primary Examiner* — Mohammed Shamsuzzaman
(74) *Attorney, Agent, or Firm* — McClure, Qualey & Rodack, LLP

(57) ABSTRACT

A method for manufacturing a semiconductor device is provided. The method includes forming a plurality of diodes on a first substrate and forming a first pattern array on a second substrate. The method also includes transferring the plurality of diodes from the first substrate to the second substrate. The method further includes forming the first pattern array on a third substrate. In addition, the method includes transferring the plurality of diodes from the second substrate to the third substrate. The method also includes forming a second pattern array on a fourth substrate. The method further includes transferring the plurality of diodes from the third substrate to the fourth substrate. The pitch between the plurality of diodes on the first substrate is different from the pitch of the first pattern array.

5 Claims, 14 Drawing Sheets

Related U.S. Application Data division of application No. 16/002,156, filed on Jun. 7, 2018, now abandoned.

(60) Provisional application No. 62/539,579, filed on Aug. 1, 2017.

(51) Int. Cl.
*H01L 25/075* (2006.01)
*H01L 25/16* (2023.01)
*H01L 33/32* (2010.01)

(52) U.S. Cl.
CPC ........ *H01L 25/0753* (2013.01); *H01L 25/167* (2013.01); *H01L 33/0075* (2013.01); *H01L 33/32* (2013.01); *H01L 2933/0066* (2013.01)

(58) Field of Classification Search
CPC ................ H01L 33/0075; H01L 33/32; H01L 2933/0066; H01L 2224/95001
See application file for complete search history.

(56) References Cited

U.S. PATENT DOCUMENTS

| | | | | |
|---|---|---|---|---|
| 9,705,029 B2* | 7/2017 | Huang | | H01L 22/12 |
| 10,170,455 B2* | 1/2019 | Lin | | H01L 33/382 |
| 10,217,729 B2* | 2/2019 | Ahmed | | H01L 24/95 |
| 10,319,877 B2* | 6/2019 | Huang | | H01L 33/62 |
| 10,325,888 B2* | 6/2019 | Lai | | H01L 24/97 |
| 10,325,893 B2* | 6/2019 | Chong | | H01L 33/00 |
| 10,366,910 B2* | 7/2019 | Liu | | H01L 33/0093 |
| 2003/0087476 A1* | 5/2003 | Oohata | | H01L 24/82 |
| | | | | 438/455 |
| 2004/0235267 A1* | 11/2004 | Sheats | | H01L 21/67132 |
| | | | | 257/E21.414 |
| 2011/0183454 A1* | 7/2011 | Jou | | H10K 71/13 |
| | | | | 438/34 |
| 2011/0299044 A1* | 12/2011 | Yeh | | H04N 9/315 |
| | | | | 353/52 |
| 2012/0156817 A1* | 6/2012 | Jou | | H10K 71/13 |
| | | | | 438/35 |
| 2013/0023179 A1* | 1/2013 | Sun | | H10K 71/18 |
| | | | | 445/24 |
| 2013/0026511 A1* | 1/2013 | Yeh | | H01L 33/54 |
| | | | | 257/89 |
| 2013/0037838 A1* | 2/2013 | Speier | | H01L 22/10 |
| | | | | 118/620 |
| 2013/0210194 A1* | 8/2013 | Bibl | | H01L 24/75 |
| | | | | 438/107 |
| 2016/0155892 A1* | 6/2016 | Li | | H01L 25/0753 |
| | | | | 257/89 |
| 2016/0336304 A1* | 11/2016 | Wu | | H01L 27/1214 |
| 2017/0263593 A1* | 9/2017 | Zou | | H01L 33/0095 |
| 2018/0096977 A1* | 4/2018 | Ahmed | | H01L 24/95 |
| 2018/0190876 A1* | 7/2018 | Liu | | H01L 33/62 |
| 2018/0261582 A1* | 9/2018 | Henry | | H01L 33/62 |
| 2018/0366450 A1* | 12/2018 | Gardner | | H01L 25/50 |
| 2019/0043843 A1* | 2/2019 | Liu | | H01L 25/0753 |

* cited by examiner

METHODS FOR MANUFACTURING SEMICONDUCTOR DEVICE

CROSS REFERENCE TO RELATED APPLICATIONS

This application is a Continuation of application Ser. No. 16/858,826, filed Apr. 27, 2020 (now U.S. Pat. No. 11,335,827), which is a divisional application of U.S. application Ser. No. 16/002,156, filed Jun. 7, 2018, (now abandoned), which claims priority of China Patent Application No. 201810178352.4 filed on Mar. 5, 2018, and also claims priority of a provisional application of U.S. Patent Application No. 62/539,579 filed on Aug. 1, 2017, the entirety of which is incorporated by reference herein.

BACKGROUND OF THE INVENTION

Field of the Invention

The embodiments of the disclosure relate to a method for manufacturing a semiconductor device, and in particular to a method for manufacturing a semiconductor device that includes a light-emitting diode.

Description of the Related Art

As digital technology develops, semiconductor devices are being used more widely in society. For example, semiconductor devices have been applied in modern information and communication devices such as televisions, notebooks, computers, mobile phones and smartphones. In addition, each generation of semiconductor devices has been developed to be thinner, lighter, smaller, and more fashionable than the previous generation. These semiconductor devices include light-emitting diode semiconductor devices.

Since mass production has recently become a trend in the light-emitting diode semiconductor device industry, any increase in the yield of manufacturing light-emitting diode semiconductor devices will reduce costs and result in huge economic benefits. However, existing light-emitting diode semiconductor devices have not been satisfactory in every respect.

Therefore, a cost-effective light-emitting diode semiconductor device that improves display quality is needed.

BRIEF SUMMARY OF THE INVENTION

The present disclosure provides a method for manufacturing a semiconductor device. The method includes forming a plurality of diodes on a first substrate and forming a first pattern array on a second substrate. The method also includes transferring the plurality of diodes from the first substrate to the second substrate. The method further includes forming the first pattern array on a third substrate. In addition, the method includes transferring the plurality of diodes from the second substrate to the third substrate. The method also includes forming a second pattern array on a fourth substrate. The method further includes transferring the plurality of diodes from the third substrate to the fourth substrate. The pitch between the plurality of diodes on the first substrate is different from the pitch of the first pattern array.

The present disclosure also provides a method for manufacturing a semiconductor device. The method includes forming a plurality of diodes on a first substrate. The method also includes providing a second substrate. The method further includes transferring the plurality of diodes from the first substrate to the second substrate. In addition, the method includes forming an adhesive layer on a third substrate. The method also includes transferring the plurality of diodes from the second substrate to the third substrate and providing a fourth substrate. The method further includes reducing an adhesion force of a portion of the adhesive layer, and transferring the plurality of diodes from the third substrate to the fourth substrate.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION OF THE INVENTION

Figure 1:
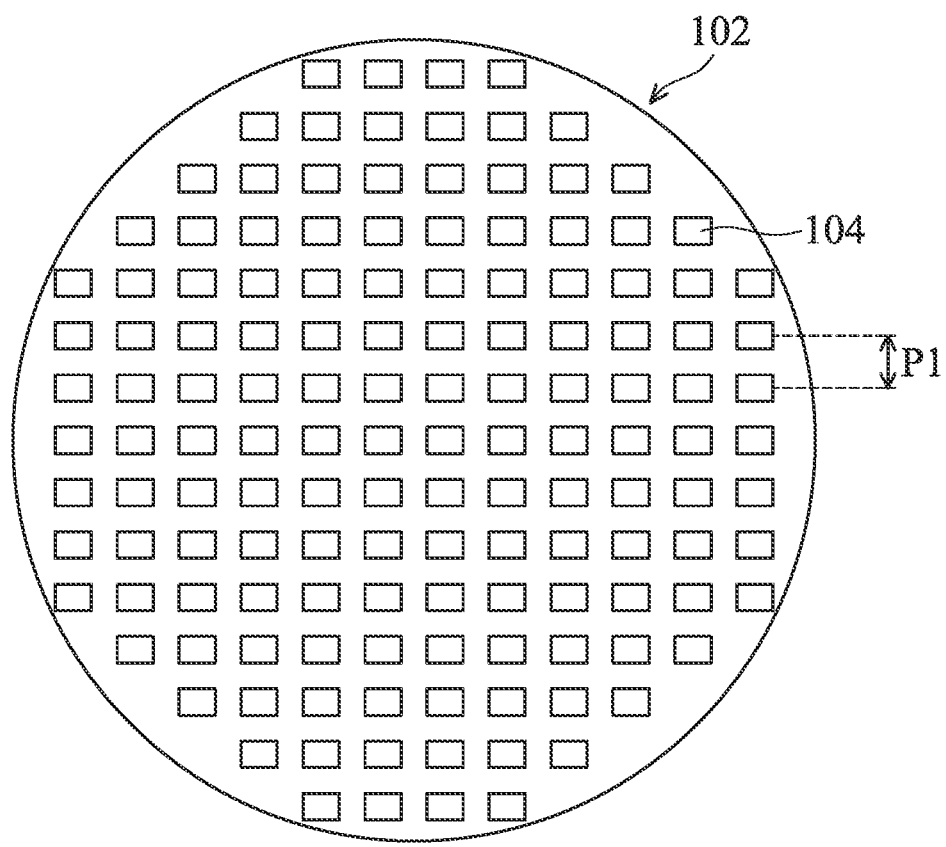
FIG. 1 is a top view of light-emitting elements and a substrate in accordance with some embodiments of the present disclosure.

The semiconductor device of the present disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

This description of the exemplary embodiments is intended to be read in connection with the accompanying drawings, which are to be considered part of the entire written description. The drawings are not drawn to scale. In addition, structures and devices are shown schematically in order to simplify the drawing.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The term "substrate" is meant to include devices formed within a transparent substrate and the layers overlying the transparent substrate. All transistor element needed may be already formed over the substrate. However, the substrate is represented with a flat surface in order to simplify the drawing. The term "substrate surface" is meant to include the uppermost exposed layers on a transparent substrate, such as an insulating layer and/or metallurgy lines.

The thickness of a structure described in the embodiments of the disclosure indicates a value for the average thickness of the structure after deleting outliers. The outliers can be the thickness of an edge, an obvious micro-trench, or an obvious micro-raised area. After deleting the outliers, most values of the thickness are within a range of plus or minus three standard deviations.

Referring to FIG. 1, FIG. 1 is a top view of a semiconductor substrate 102 and light-emitting elements 104 in accordance with some embodiments of the present disclosure. In some embodiments, as shown in FIG. 1, a plurality of the light-emitting elements 104 are formed over the semiconductor substrate 102 (in FIG. 8A, a semiconductor substrate 160 may correspond to the semiconductor substrate 102 of FIG. 1, and light-emitting elements 162 may correspond to the light-emitting elements 104 of FIG. 1), and there is a pitch P1 between two adjacent light-emitting elements 104. The pitch P1 is the distance between the centers of two adjacent light-emitting elements 104. In some embodiments, the pitch P1 is in a range of about 30 μm to about 150 μm. In some embodiments, the semiconductor substrate 102 is a wafer such as a sapphire substrate which is composed of alumina oxide and gallium nitride formed thereon.

Figure 2:
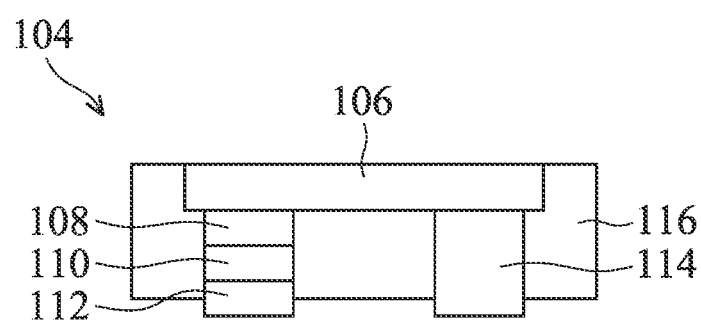
FIG. 2 is a cross-sectional view of a light-emitting element in accordance with some embodiments of the present disclosure.

FIG. 2 is a cross-sectional view of the light-emitting element 104 in accordance with some embodiments of the present disclosure. In some embodiments, examples of light-emitting elements include, but are not limited to, an organic light-emitting diode (OLED), a quantum dot (QD), a fluorescent material, a phosphor material, a light-emitting diode (LED), a micro light-emitting diode, and a mini light-emitting diode. In some embodiments, the size of the chip of the light-emitting diode is, but is not limited to, in a range of about 300 μm to about 10 mm, the size of the chip of the micro light-emitting diode is, but is not limited to, in a range of about 100 μm to about 300 μm, the size of the chip of the mini light-emitting diode is, but is not limited to, in a range of about 1 μm to about 100 μm. In some embodiments, the semiconductor device may be, but is not limited to, a flexible display device, a touch display device or a curved display device. In some embodiments, the light-emitting element can be used as a backlight module of a liquid display device, but it is not limited thereto. As shown in FIG. 2, the light-emitting elements 104 include a semiconductor layer 106, a light-emitting layer 108, a semiconductor layer 110, a conductive pad 112, a conductive pad 114 and a protective layer 116. It should be appreciated that there are some elements that are not illustrated in the light-emitting elements 104 shown in FIG. 2. In some embodiments, the light-emitting element 104 includes other elements. The recombination of electron and hole in the light-emitting diodes (LEDs) may produce electromagnetic radiation (such as light) through the current at the p-n junction. For example, in the forward bias p-n junction formed by direct band gap materials such as GaAs or GaN, the recombination of electron and hole injected into the depletion region results in electromagnetic radiation. The aforementioned electromagnetic radiation may lie in the visible region or the non-visible region. Materials with different band gaps may be used to form light-emitting diodes of different colors.

As shown in FIG. 2, the semiconductor layer 106 and the semiconductor layer 110 adjoin the conductive pad 114 and the conductive pad 112, respectively. The semiconductor layer 106 and the semiconductor layer 110 may include, but are not limited to, an element semiconductor which may include amorphous-Si, poly-Si, germanium; a compound semiconductor which may include gallium nitride (GaN), silicon carbide, gallium arsenide, gallium phosphide, indium phosphide, indium arsenide and/or indium antimonide; an alloy semiconductor which may include SiGe alloy, GaAsP alloy, AlInAs alloy, AlGaAs alloy, GaInAs alloy, GaInP alloy, GaInAsP alloy, or a combination thereof. The semiconductor layer 106 and the semiconductor layer 110 may also include, but are not limited to, metal oxide such as indium gallium zinc oxide (IGZO), indium zinc oxide (IZO), indium gallium zinc oxide (IGZTO), or organic semiconductor including polycyclic aromatic compound, or a combination thereof.

As shown in FIG. 2, the light-emitting layer 108 may include, but is not limited to, homojunction, heterojunction, single-quantum well (SQW), multiple-quantum well (MQW) or any other applicable structure. In some embodiments, the light-emitting layer 108 includes un-doped n type $In_xGa_{(1-x)}N$. In other embodiments, the light-emitting layer 108 includes such materials as $Al_xIn_yGa_{(1-x-y)}N$ and other materials. Moreover, the light-emitting layer 108 may include a multiple-quantum well structure with multiple-quantum layers (such as InGaN) and barrier layers (such as GaN) arranged alternately. Moreover, the light-emitting layer 108 may be formed by metalorganic chemical vapor deposition (MOCVD), molecular beam epitaxy (MBE), hydride vapor phase epitaxy (HVPE), liquid phase epitaxy (LPE) or any other applicable chemical vapor deposition process.

As shown in FIG. 2, the protective layer 116 is disposed on sidewalls of the semiconductor layer 106, the light-emitting layer 108, the semiconductor layer 110 and portions of the conductive pad 112 and the conductive pad 114. The protective layer 116 is disposed over at least some regions of the light-emitting path, the light-emitting shape may be altered or the light-emitting effectiveness may be improved. In some embodiments, the material of the protective layer 116 may be an organic material, an inorganic material, a metal oxide, a metal or other applicable materials.

As shown in FIG. 2, the conductive pad 112 is electrically connected to the semiconductor layer 110, and the conductive pad 114 is electrically connected to the semiconductor layer 106. The material of the conductive pad 112 and the conductive pad 114 may include, but are not limited to, copper (Cu), aluminum (Al), molybdenum (Mo), tungsten (W), gold (Au), chromium (Cr), nickel (Ni), platinum (Pt), titanium (Ti), the above alloys, the above combination or any other applicable materials.

Figure 3A:
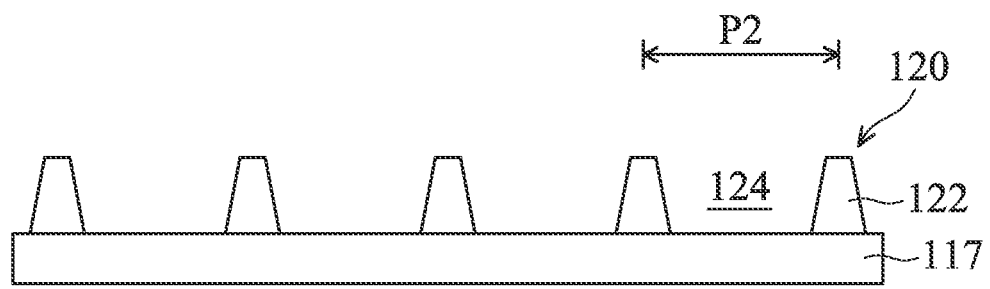
FIGS. 3A-3F are cross-sectional views of various stages of a process for manufacturing a semiconductor device in accordance with some embodiments of the present disclosure.

FIGS. 3A-3F are cross-sectional views of various stages of a process for manufacturing a semiconductor device 100A in accordance with some embodiments of the present disclosure. As shown in FIG. 3A, a substrate 117 is provided. The substrate 117 may include such as a glass substrate, a ceramic substrate, a plastic substrate or another applicable substrate. In some embodiments, the substrate 117 is a carrier substrate. In the subsequent processes, the light-emitting elements will be disposed on the substrate 117 temporarily, and removed from the substrate 117. In some embodiments, the semiconductor device 100A includes a display device.

Figure 4:
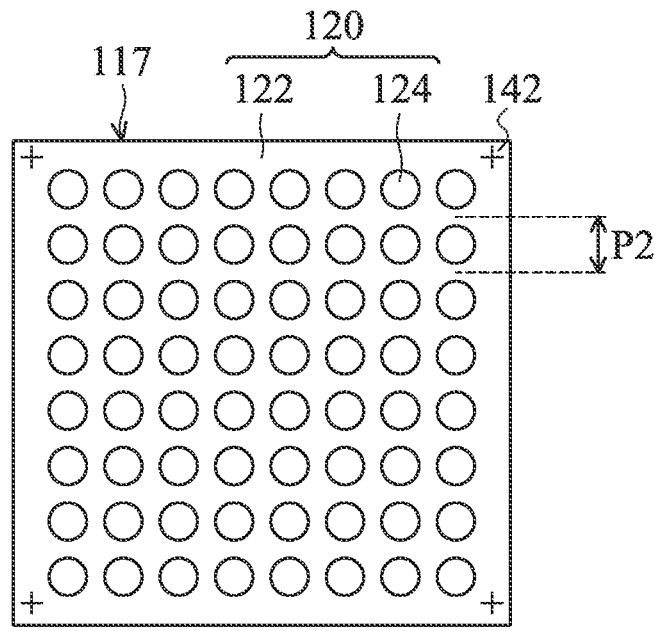
FIG. 4 is a top view of a substrate in accordance with some embodiments of the present disclosure.

FIG. 4 is a top view of the substrate 117 in accordance with some embodiments of the present disclosure. As shown in FIGS. 3A and 4, the substrate 117 includes a pattern array 120. In some embodiments, the pattern array 120 includes a spacer layer 122 and openings 124. The spacer layer 122 includes a plurality of openings 124 formed therein, and the top surface of the substrate 117 is exposed from the openings 124. In the subsequent processes, the openings 124 are positions where the light-emitting elements are disposed temporarily. The spacer layer 122 is used to separate two adjacent light-emitting elements, and corresponds to or aligns to the spacer layer on another substrate.

The spacer layer 122 may be such as, but is not limited to, a photoresist. In some embodiments, a photoresist layer is coated on the substrate 117, and is patterned by a lithography process and an etching process so that the pattern array 120 is formed. The photoresist remaining on the substrate 117 forms the spacer layer 122, and the portions of the photoresist removed from the substrate 117 form the openings 124. The lithography process includes, but is not limited to, photoresist coating (e.g., spin-on coating), soft baking, mask alignment, exposure, post-exposure baking, developing the photoresist, rinsing and drying (e.g., hard baking). The photolithography process may also be implemented or replaced by another proper method such as maskless photolithography, electron-beam writing or ion-beam writing. The etching process may include, but is not limited to, dry etching, wet etching, and other etching methods. The deposition process includes, but is not limited to, chemical vapor deposition (CVD), sputtering, resistive thermal evaporation, electron beam evaporation, and any other applicable methods.

As shown in FIG. 4, the shape of the openings 124 is a circle from a top view. Many variations and/or modifications can be made to embodiments of the disclosure. In some embodiments, the shape of the openings 124 is a square, a rectangle or a combination thereof.

In some embodiments, as shown in FIGS. 3A and 4, the pattern array 120 has a pitch P2. The pitch P2 is the distance between the centers of two adjacent spacer layers 122 located on two sides of the openings 124. In some embodiments, the pitch P2 is, but is not limited to, in a range of about 30 μm to about 600 μm. In some embodiments, the pitch P2 is the distance between two sub-pixels. In some embodiments, the pitch P2 is n times greater than the pitch between two adjacent sub-pixels of the semiconductor device. For example, n is equivalent to 3.

Next, referring 3B, an adhesive layer 126 is formed on the substrate 117 and in the openings 124. The adhesive layer 126 can also be regarded as a part of the pattern array 120. The adhesive layer 126 is configured to attach the light-emitting elements. In some embodiments, the material of the adhesive layer 126 includes, but is not limited to, optical adhesive (OCA), optical clear resin (OCR) or other suitable transparent materials. In some embodiments, the material of the adhesive layer 126 is sprayed into the openings 124 by an inkjet or a printing process.

Figure 3B:
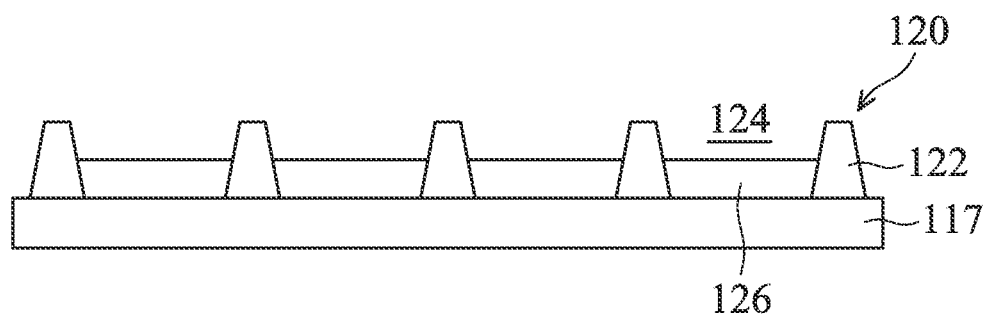
Figure 3C:
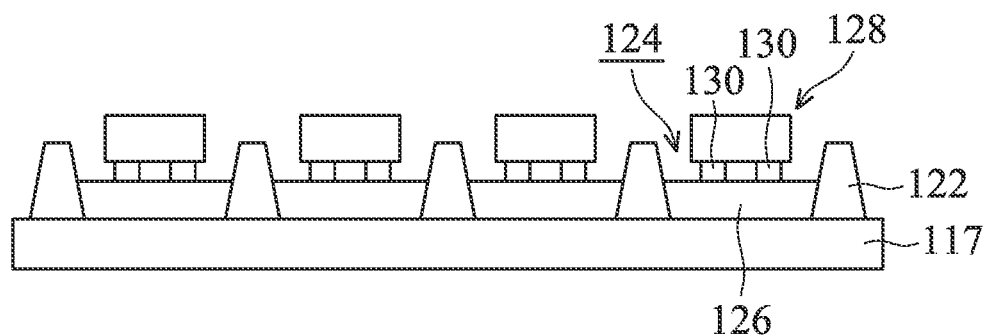
Figure 3C:
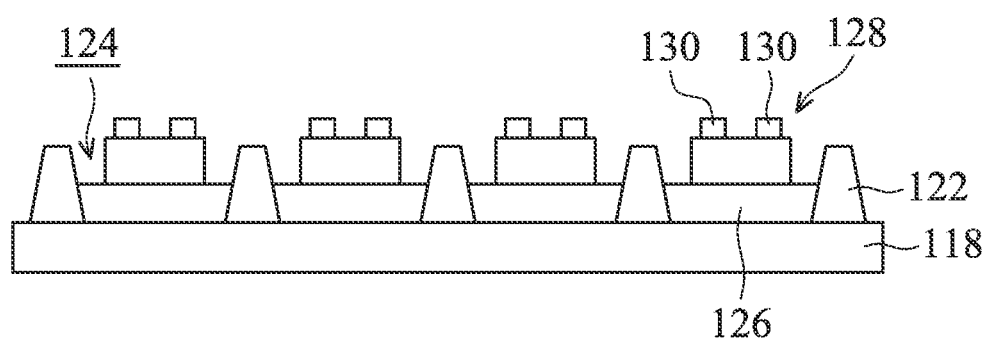

Next, as illustrated in FIG. 3C(a), a plurality of light-emitting elements 128 are disposed on the substrate 117. The light-emitting elements 128 are surrounded by the spacer layer 122, and two adjacent light-emitting elements 128 are separated from each other by the spacer layer 122. The light-emitting elements 128 are fixed on the substrate 117 by the adhesive layer 126. In some embodiments, conductive bumps 130 of the light-emitting elements 128 are in contact with the adhesive layer 126 so that the light-emitting elements 128 are bonded to the substrate 117. The light-emitting elements 128 may include at least two conductive bumps 130, wherein one of the conductive bumps 130 includes the light-emitting layer 108, the semiconductor layer 110 and the conductive pad 112, and one of the conductive bumps 130 may be the conductive pad 114 of FIG. 2.

Next, as seen in FIG. 3C(b), the plurality of light-emitting elements 128 are disposed on a substrate 118. The substrate 118 may be the same as or similar to the substrate 117. The light-emitting elements 128 are surrounded by the spacer layer 122, and two adjacent light-emitting elements 128 are separated from each other by the spacer layer 122. The light-emitting elements 128 are fixed on the substrate 118 by the adhesive layer 126. In some embodiments, one of the semiconductor layer 106 of the light-emitting elements 128 is in contact with the adhesive layer 126, and the conductive bumps 130 are far from the surface of the adhesive layer 126.

In some embodiments, as shown in FIG. 3C(b), the light-emitting elements 128 include at least two conductive bumps 130. The conductive bumps 130 are electrically connected to another substrate having electronic elements. The material of the conductive bumps 130 may be an alloy with low melting point. In some embodiments, the conductive bumps 130 is a eutectic material whose melting point is smaller than 300° C. The material of the conductive bumps 130 may include, but is not limited to, a tin-indium alloy, a tin-zinc alloy, a tin-silver alloy, a gold-indium alloy, a gold-tin alloy or other suitable materials. In some embodiments, the conductive bump 130 is a multilayer stack structure, such as a copper/nickel/gold structure or a nickel/platinum/gold structure.

In some embodiments, the light-emitting elements 104 formed on the semiconductor substrate 102 shown in FIG. 1 can be disposed in the openings 124 on the substrate 118. Two adjacent light-emitting elements 128 shown in FIG. 3(b) are not necessarily two adjacent light-emitting elements 104 in FIG. 1. For example, two adjacent light-emitting elements 128 shown in FIG. 3(b) are two light-emitting elements 104 which are separated by three light-emitting elements. Therefore, in this embodiment, the pitch P1 is not equivalent to the pitch P2.

Figure 3D:
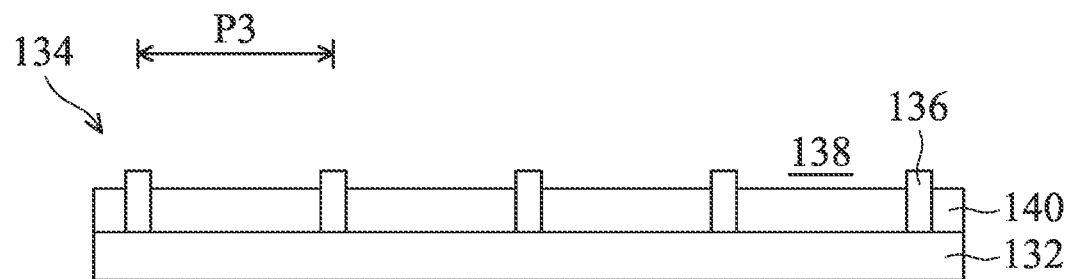

Next, as illustrated in FIG. 3D, a substrate 132 is provided. In some embodiments, the substrate 132 is a backplane of the semiconductor device on which the light-emitting elements 128 are disposed. In some embodiments, openings 138 of the substrate 132 are positions where the light-emitting elements 128 are disposed. The substrate 132 may include a semiconductor element layer. The semiconductor element layer includes an integrated circuit (IC). The IC may include, but is not limited to, a micro-processor, a memory element and/or other elements. The IC may also include various passive and active microelectronic devices, such as thin film resistors, other capacitors (e.g., metal-insulator-metal capacitor, MIMCAP), inductors, diodes, metal-oxide-semiconductor field effect transistors (MOSFETs), complementary MOS (CMOS) transistors, bipolar junction transistors (BJTs), laterally diffused MOS (LD-MOS) transistors, high power MOS transistors, or other types of transistors.

Figure 5:
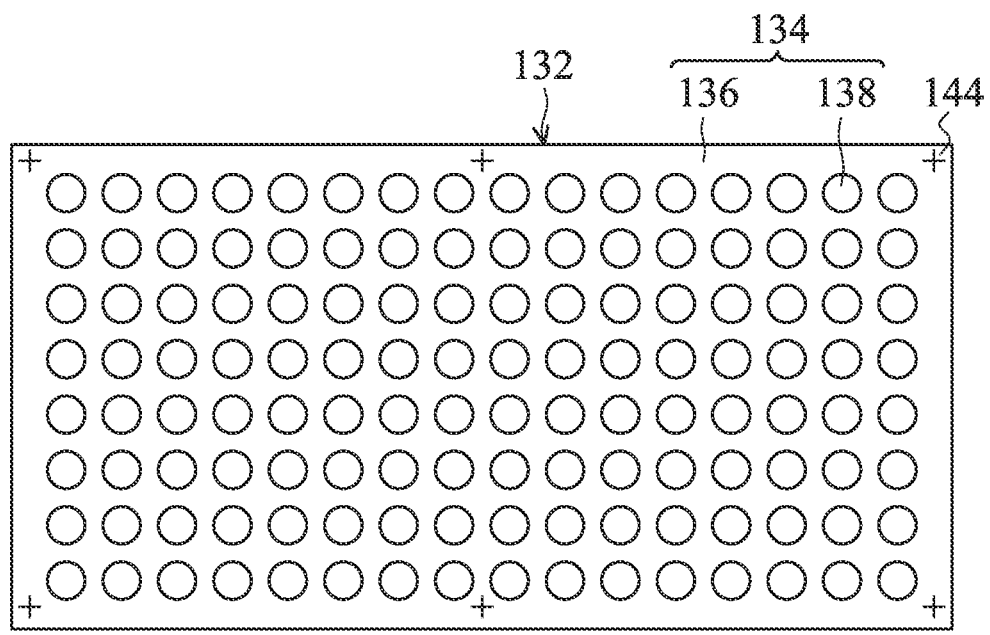
FIG. 5 is a top view of a substrate of a semiconductor device in accordance with some embodiments of the present disclosure.

FIG. 5 is a top view of the substrate 132 of a semiconductor device in accordance with some embodiments of the present disclosure. As shown in FIGS. 3D and 5, the substrate 132 has a pattern array 134. In some embodiments, the pattern array 134 includes a spacer layer 136 and openings 138. The openings 138 are surrounded by the spacer layer 136. The openings 138 are positions where the light-emitting elements 128 are disposed. The spacer layer 136 is configured to separate two adjacent light-emitting elements 128, and used to attach to or align to the spacer layer 122 of the substrate 118. In some embodiments, the spacer layer 136 is, but is not limited to, an insulating layer, a light-shielding layer or a photoresist layer.

In some embodiments, the materials and the formation methods of the pattern array 134, the spacer layer 136 and the openings 138 are the same as or similar to those of the pattern array 120, the spacer layer 122 and the openings 124, respectively, and are not repeated herein.

As shown in FIG. 5, the shape of the openings 138 is a circle from a top view. Many variations and/or modifications can be made to embodiments of the disclosure. In some embodiments, the shape of the openings 138 is a square, a rectangle or a combination thereof.

In some embodiments, as shown in FIGS. 3D and 5, the pattern array 134 has a pitch P3. The pitch P3 is the distance between centers of two adjacent spacer layers 136 located on two sides of the openings 138. In some embodiments, the pitch P3 is, but is not limited to, in a range of about 30 μm to about 600 μm. In some embodiments, the pitch P3 is the distance between two sub-pixels. In some embodiments, the pitch P2 is substantially equivalent to the pitch P3. In some embodiments, the pitch P2 is integer times greater than the pitch P3.

As shown in FIG. 3D, a conductive layer 140 is formed on the substrate 132 and in the openings 138. The conductive layer 140 is configured to bond the conductive bumps 130 on the light-emitting elements 128. In some embodiments, the materials of the conductive layer 140 are the same as or similar to those of the conductive bump 130.

Figure 3E:
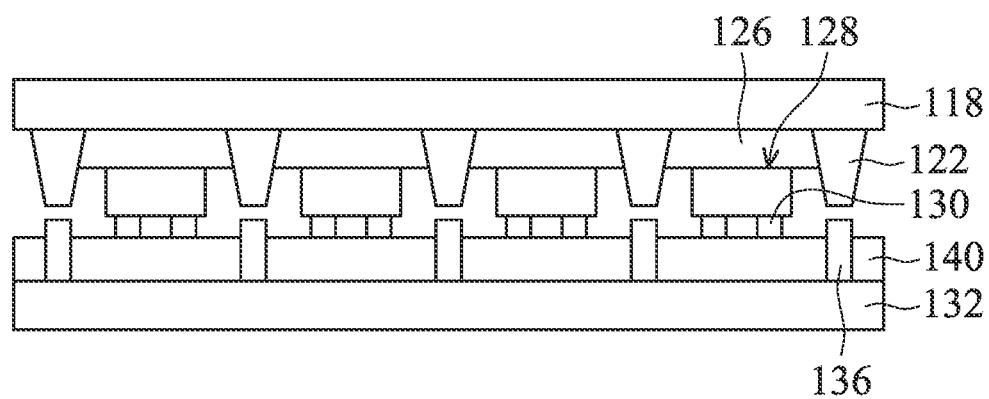

Referring to FIG. 3E, the spacer layer 122 of the substrate 118 is aligned with the spacer layer 136 of the substrate 132. Next, as shown in FIG. 3E, the conductive bumps 130 of the light-emitting elements 128 are attached to the conductive layer 140 on the substrate 132. Referring to FIGS. 4 and 5, an alignment mark 142 on the substrate 118 may be aligned with an alignment mark 144 on the substrate 132 so that the spacer layer 122 can be aligned with the spacer layer 136. In some embodiments, as shown in FIG. 3E, the pitch P2 is substantially to the pitch P3. In some embodiments, during the bonding between the conductive bumps 130 and the conductive layer 140, the temperature is in a range of about 100° C. to about 400° C.

Figure 3F:
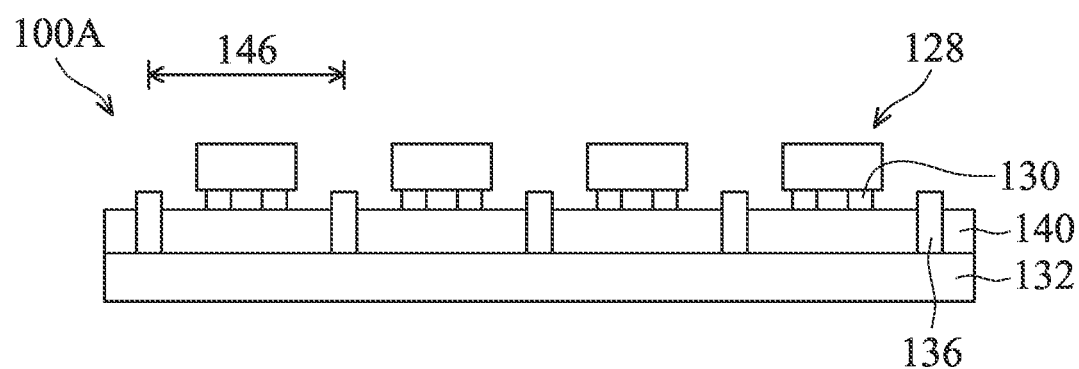

Referring to FIG. 3F, the substrate 118, the spacer layer 122 and the adhesive layer 126 formed on the substrate 118 shown in FIG. 3E are removed from the light-emitting elements 128. Next, as shown in FIG. 3F, the light-emitting elements 128 are transferred into the openings 138 on the substrate 132 from the substrate 118, and the semiconductor device 100A is created. As shown in FIG. 3F, the semiconductor device 100A includes multiple sub-pixels 146. The sub-pixel 146 may be a visible light sub-pixel (such as a blue sub-pixel, a red sub-pixel, a green sub-pixel), an infrared sub-pixel or a ultraviolet sub-pixel which correspond to different wavelengths of the light emitted.

In some embodiments, the substrate 118, the spacer layer 122 and the adhesive layer 126 formed on the substrate 118 are removed from the light-emitting elements 128 by heating or irradiation (such as ultraviolet).

In some embodiments, the pitch P1 is smaller than or equivalent to the pitch P2 or the pitch P3, and the pitch P2 is substantially equivalent to or greater than the pitch P3. In some embodiments, one or more steps can be used to transfer the light-emitting elements 128 from the semiconductor substrate (such as the semiconductor substrate 102 shown in FIG. 1) to the substrate 118 so that the light-emitting elements 128 are formed in every openings 124 in the substrate 118. Next, all of the light-emitting elements 128 on the substrate 118 are transferred to the substrate 132 in one step by aligning the alignment mark 142 (shown in FIG. 4) on the substrate 118 to the alignment mark 144 (shown in FIG. 5) on the substrate 132.

Many variations and/or modifications can be made to embodiments of the disclosure. In some embodiments, the light-emitting elements 128 can be selectively disposed in the openings 138 on the substrate 132. FIGS. 6A-6D are cross-sectional views of various stages of a process for manufacturing a semiconductor device 100B in accordance with some embodiments of the present disclosure. One of the differences between this embodiment and the embodiment shown in FIG. 3A-3F is that the adhesive layer is formed over whole surface in the embodiment shown in FIGS. 3A-3F, and therefore the light-emitting elements are transferred entirely. In this embodiment, the adhesive layer can be patterned or selectively formed in some of the openings, and therefore the light-emitting elements can be transferred selectively.

Figure 6A:
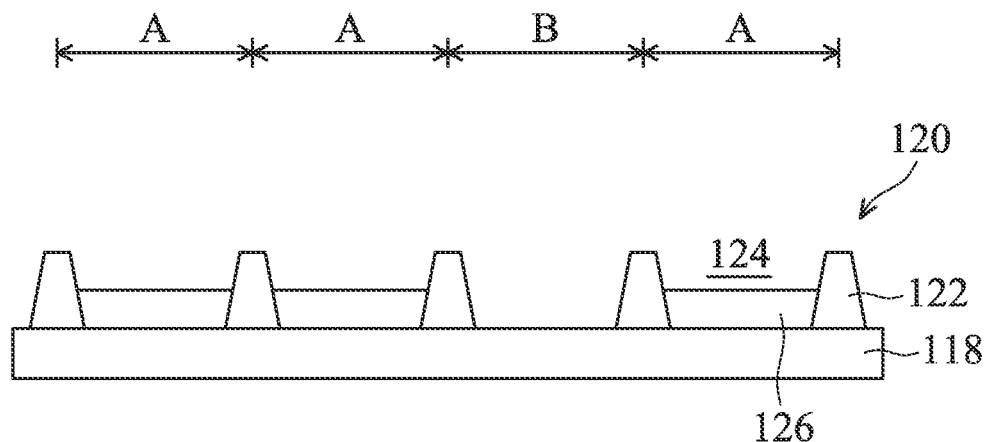
FIGS. 6A-6D are cross-sectional views of various stages of a process for manufacturing a semiconductor device in accordance with some embodiments of the present disclosure.

In some embodiments, as shown in FIG. 6A, the adhesive layer 126 is not formed in all of the openings 124 of the pattern array 120. As shown in FIG. 6A, the adhesive layer 126 is formed in the region A but not in the region B. In some embodiments, the adhesive material is sprayed into all of the openings 124 of the pattern array 120 to form the adhesive layer 126 by an inkjet printing process. Next, the region B is selectively heated or illuminated so that the viscosity or adhesion force of the adhesive layer 126 in the region B is reduced so that the adhesive layer 126 in the region B can be removed. In this embodiment, the region A is not heated or illuminated. Many variations and/or modifications can be made to embodiments of the disclosure. In some embodiments, the adhesive layer 126 can be formed by spraying the adhesive material to a portion of the openings 124 of the pattern array 120 selectively. Furthermore, the pattern of the adhesive layer 126 shown in FIG. 6A can also be applied in the substrate 117.

Figure 6B:
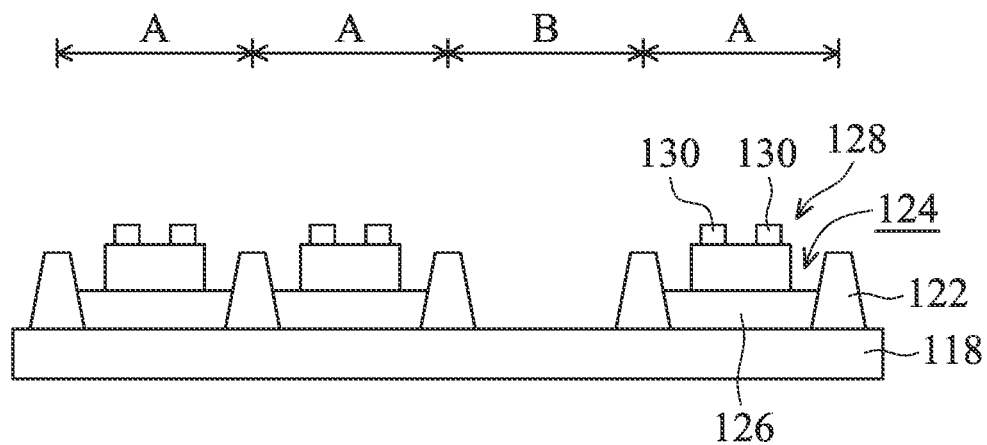

Next, in some embodiments, as shown in FIG. 6B, the light-emitting elements 128 are attached to the substrate 118. As shown in FIG. 6B, there is no adhesive layer 126 in the region B, and therefore the light-emitting elements 128 are not formed on the region B. In some embodiments, the light-emitting elements 128 are formed on the region A having the adhesive layer 126.

Figure 6C:
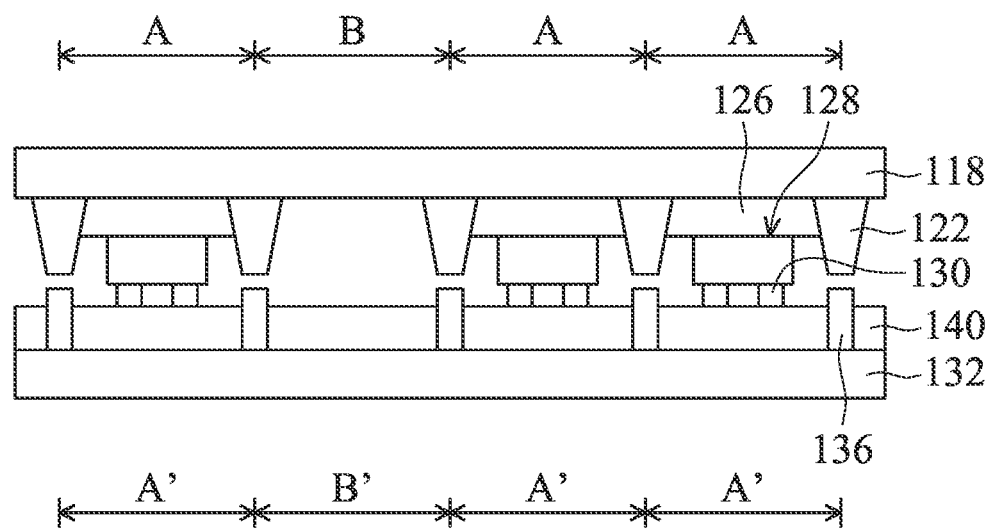

Next, in some embodiments, as shown in FIG. 6C, the spacer layer 122 on the substrate 118 is aligned with the spacer layer 136 on the substrate 132. Next, as shown in FIG. 6C, the conductive bumps 130 on the light-emitting elements 128 are attached to the conductive layer 140 on the substrate 132. In some embodiments, the process shown in FIG. 6C is the same as or similar to that shown in FIG. 3E, and is not repeated herein. As shown in FIG. 6C, the substrate 132 has a region A' and a region B' which are correspond to the region A and region B of the pattern array 120, respectively. In some embodiments, it is desired that the light-emitting elements 128 be disposed in region A', and it is not desired that the light-emitting elements 128 be disposed in region B' in the subsequent process.

In order to clearly describe the process of the embodiment, the light-emitting elements 128 are not disposed on the region B' in FIG. 6C. In some embodiments, before the spacer layer 122 of the substrate 118 is corresponded to or aligned with the spacer layer 136 on the substrate 132, the light-emitting elements 128 have already been formed on region B' of the substrate, but not on region A'.

Figure 6D:
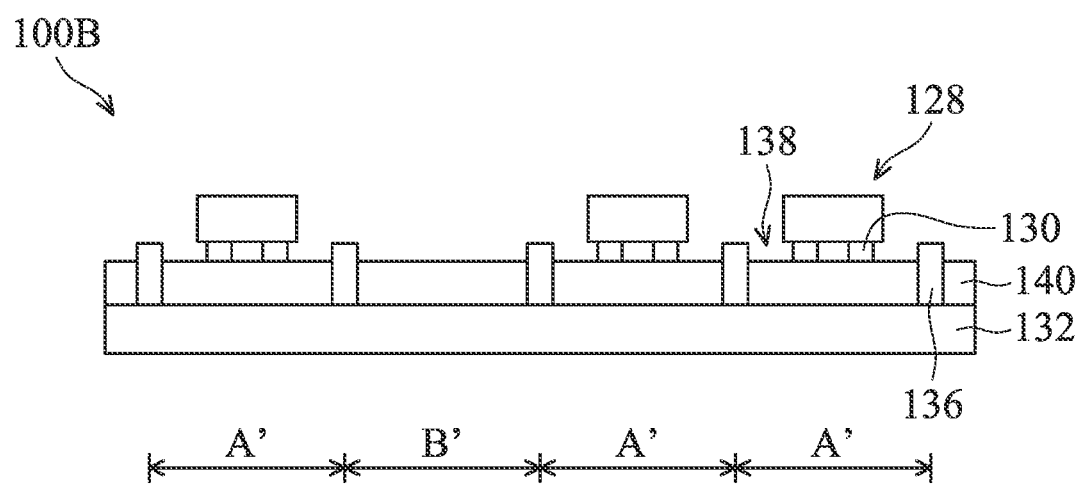

Next, in some embodiments, as shown in FIG. 6D, the substrate 118, the spacer layer 122 and the adhesive layer 126 formed on the substrate 118 shown in FIG. 6C are removed from the light-emitting elements 128. Next, as shown in FIG. 6D, the light-emitting elements 128 are transferred into the openings 138 on the substrate 132 from the substrate 118, and the semiconductor device 100B is created. As shown in FIG. 6D, the light-emitting elements 128 are transferred to the region A' of the substrate 132 from the region A of the substrate 118. In some embodiments, in the step shown in FIG. 6D, the light-emitting elements 128 are not transferred into all of the openings 138 on the substrate 132. In other words, the light-emitting elements 128 are transferred into a portion of the openings 138 on the substrate 132 selectively.

In some embodiments, a pattern array is formed on a carrier substrate. The pattern array has multiple openings. The adhesive layer is formed in a portion of the openings selectively, and thereby the light-emitting elements on the semiconductor wafer can be transferred to the carrier substrate selectively. Next, the light-emitting elements on the carrier substrate are transferred to a backplane of a semiconductor device. This way, the light-emitting elements are only transferred to the desired sub-pixels. Moreover, the light-emitting elements can also be transferred to all of the sub-pixels of the backplane of the semiconductor device entirely using the aforementioned processes.

Figure 7A:
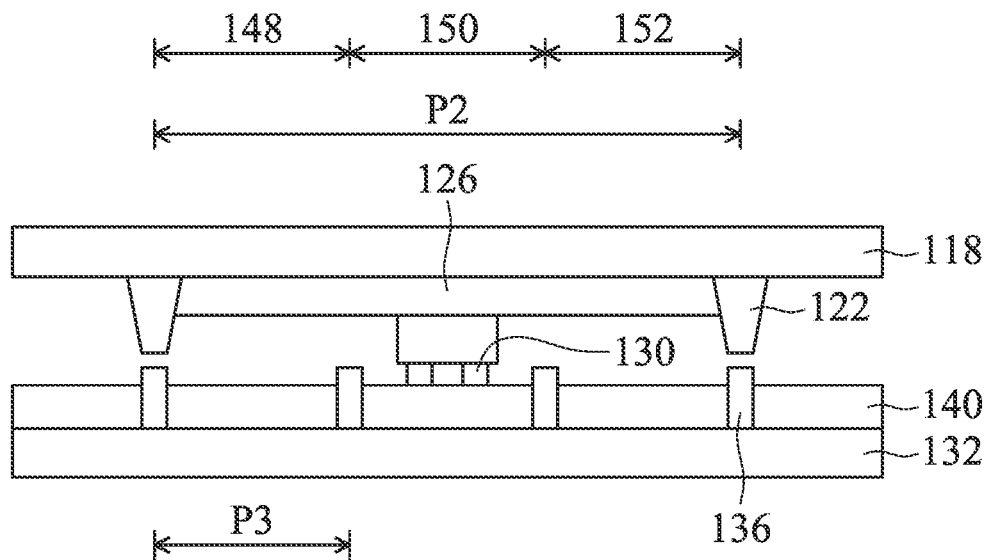
FIGS. 7A-7B are cross-sectional views of two stages of a process for manufacturing a semiconductor device in accordance with some embodiments of the present disclosure.
Figure 7B:
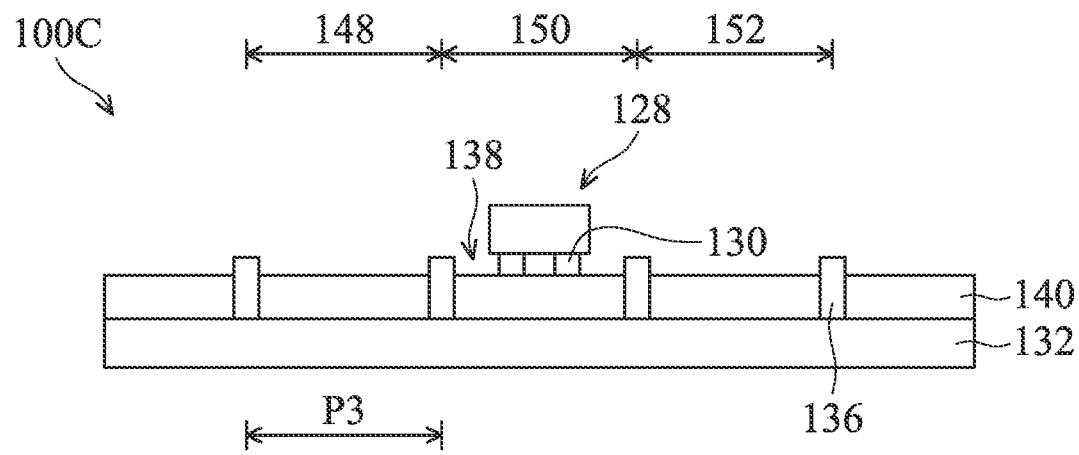

Many variations and/or modifications can be made to embodiments of the disclosure. In some embodiments, the pitch P2 is integer times greater than the pitch P3. FIGS. 7A and 7B are cross-sectional views of two stages of a process for manufacturing a semiconductor device 100C in accordance with some embodiments of the present disclosure. In some embodiments, the processes before FIG. 7 are the same as or similar to those shown in FIGS. 3A-3D and are not repeated herein.

As shown in FIG. 7A, the pitch P2 of the pattern array 120 of the substrate 118 is three times larger than the pitch P3 of the pattern array 134 on the substrate 132. Many variations and/or modifications can be made to embodiments of the disclosure. In some embodiments, the pitch P2 of the pattern array 120 of the substrate 118 is two or more times larger than the pitch P3 of the pattern array 134 on the substrate 132. In some embodiments, the process shown in FIG. 7 is the same as or similar to that shown in FIG. 3E and is not repeated herein.

Next, as shown in FIG. 7B, the substrate 118, the spacer layer 122 and the adhesive layer 126 formed on the substrate 118 shown in FIG. 7A are removed from the light-emitting elements 128. Next, as shown in FIG. 7B, the light-emitting elements 128 are transferred into the openings 138 on the substrate 132 from the substrate 118, and the semiconductor device 100C is created. In this embodiment, as shown in FIG. 7B, the semiconductor device 100C includes a blue sub-pixel 148, a green sub-pixel 150 and a red sub-pixel 152, which correspond to different wavelengths of the light emitted. In this embodiment, the light-emitting element 128 disposed in the green sub-pixel 150 emits green light. In this embodiment, the processes shown in FIGS. 7A and 7B can be used to put the light-emitting elements 128 emitting blue light and the light-emitting elements 128 emitting red light into the blue sub-pixel 148 and the red sub-pixel 152, respectively.

Figure 8A:
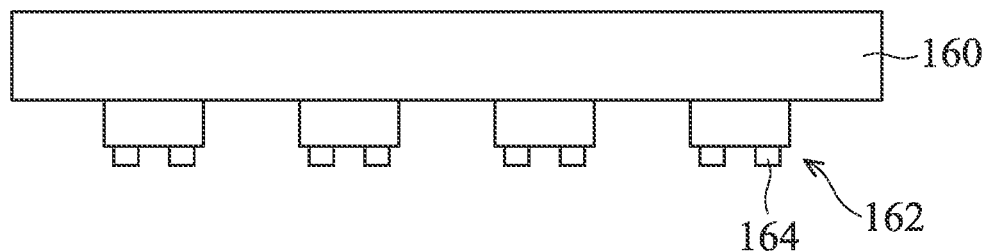
FIGS. 8A-8G are cross-sectional views of various stages of a process for selectively transferring light-emitting elements from a substrate to another substrate in accordance with some embodiments of the present disclosure.

FIGS. 8A-8G are cross-sectional views of various stages of a process for selectively transferring light-emitting elements from a substrate to another substrate in accordance with some embodiments of the present disclosure. As shown in FIG. 8A, a semiconductor substrate 160 is provided. In some embodiments, the semiconductor substrate 160 is a wafer such as a sapphire substrate which is composed of alumina oxide and gallium nitride formed thereon. As shown in a plurality of light-emitting elements 162 are formed on the semiconductor substrate 160, and conductive bumps 164 of the light-emitting elements 162 are formed thereon far from the semiconductor substrate 160. In some embodiments, the light-emitting elements 162 and the conductive bumps 164 are the same as or similar to the light-emitting elements 128 and the conductive bumps 130 shown in FIG. 3C, and are not repeated herein.

Figure 8B:
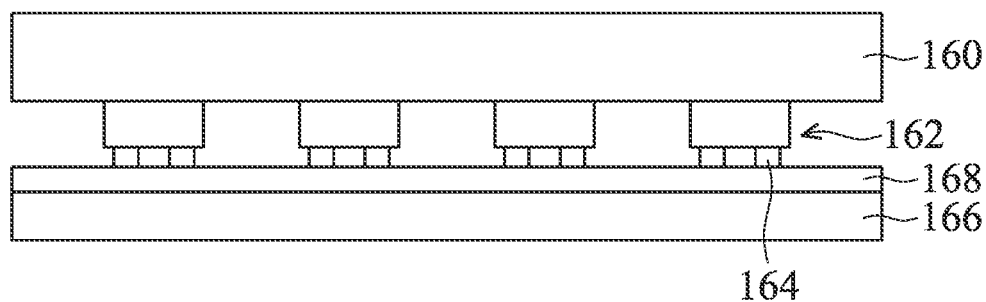

In some embodiments, as shown in FIG. 8B, the light-emitting elements 162 are attached to a substrate 166. In some embodiments, the light-emitting elements 162 are attached to the substrate 166 by an adhesive layer 168. In some embodiments, the substrate 166 is a carrier substrate. In the subsequent processes, the light-emitting elements 162 are removed from the substrate 166. The substrate 166 may include a transparent substrate such as a glass substrate, a ceramic substrate, a plastic substrate or another applicable substrate. In some embodiments, the substrate 166 can also be a conductive substrate such as a metal substrate. The material of the adhesive layer 168 can also be a polymer or other applicable materials. In order to prevent the light-emitting elements 162 from stripping from the adhesive layer 168 in the subsequent laser lift off (LLO) process, a higher adhesion force is needed between the conductive bumps 164 and the adhesive layer 168. In some embodiments, the adhesive layer 168 is not a heat sensitive or a photo sensitive material. When the adhesive layer 168 is cured, the adhesive layer 168 is removed by a chemical solvent or solution.

Figure 8C:
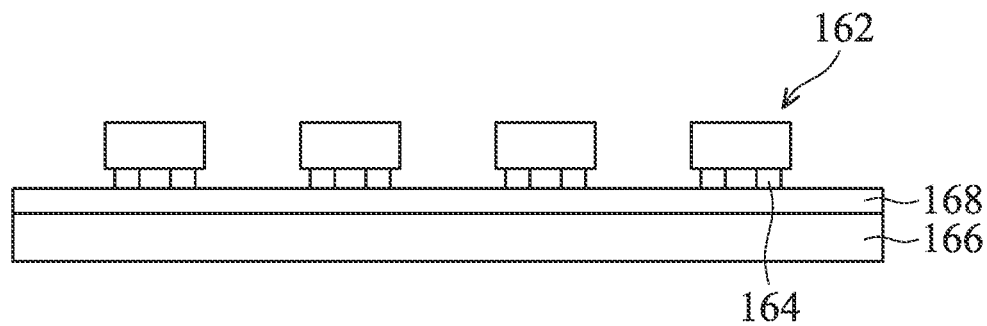

In some embodiments, as shown in FIG. 8C, the light-emitting elements 162 are removed from the semiconductor substrate 160. In some embodiments, the light-emitting elements 162 are separated from the semiconductor substrate 160 by using a LLO process. For example, a KrF excimer laser with wavelength 248 nm is used as a light source of the LLO process. Next, as shown in FIG. 8C, the light-emitting elements 162 remain on the substrate 166 after the LLO process.

Figure 8D:
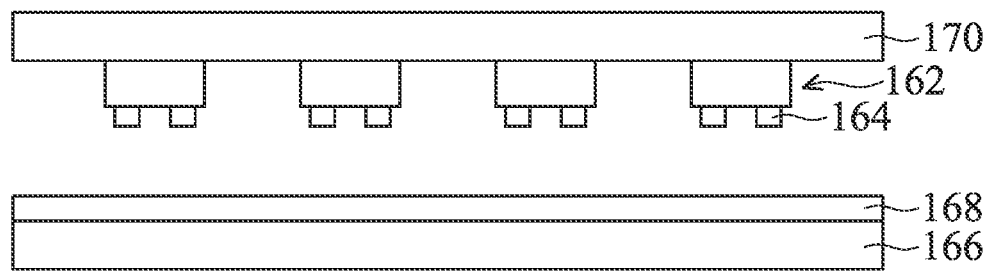

In some embodiments, as shown in FIG. 8D, the light-emitting elements 162 are transferred to a substrate 170 from the substrate 166. In some embodiments, the substrate 170 includes a microelectromechanical system (MEMS) device. In some embodiments, the light-emitting elements 162 are transferred to the substrate 170 from the substrate 166 by a vacuum suction force or a static electricity force.

Figure 8E:
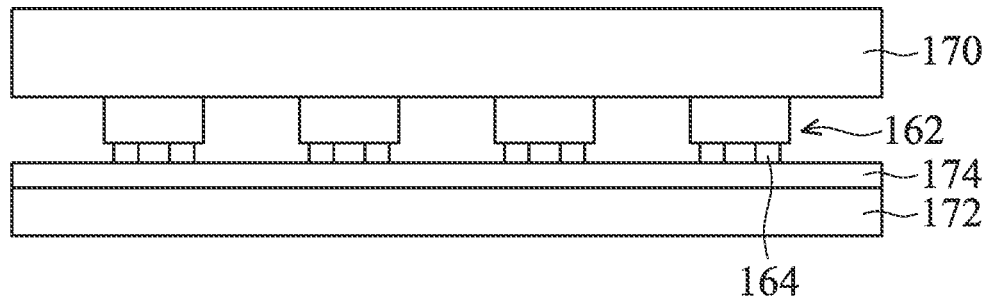

In some embodiments, as shown in FIG. 8E, the light-emitting elements 162 are attached to a substrate 172. As shown in FIG. 8E, the light-emitting elements 162 are fixed on the substrate 172 by attaching the conductive bumps 164 into the adhesive layer 174. In some embodiments, the substrate 172 is a carrier substrate and the light-emitting elements 162 are removed from the substrate 172 in the subsequent process. The substrate 172 may include a transparent substrate such as a glass substrate, a ceramic substrate, a plastic substrate or another applicable substrate. In some embodiments, the substrate 172 can also be a conductive substrate such as a metal substrate. The material of the adhesive layer 174 can also be a polymer or other applicable materials. In some embodiments, the adhesive layer 174 is a photo sensitive and/or a heat sensitive material. Namely, when the adhesive layer 174 is illuminated or heated, the viscosity or adhesion force of the adhesive layer 174 is reduced. In some embodiments, the adhesive layer 174 may be, but is not limited to, a UV debond material or a thermal debond material.

Figure 8F:
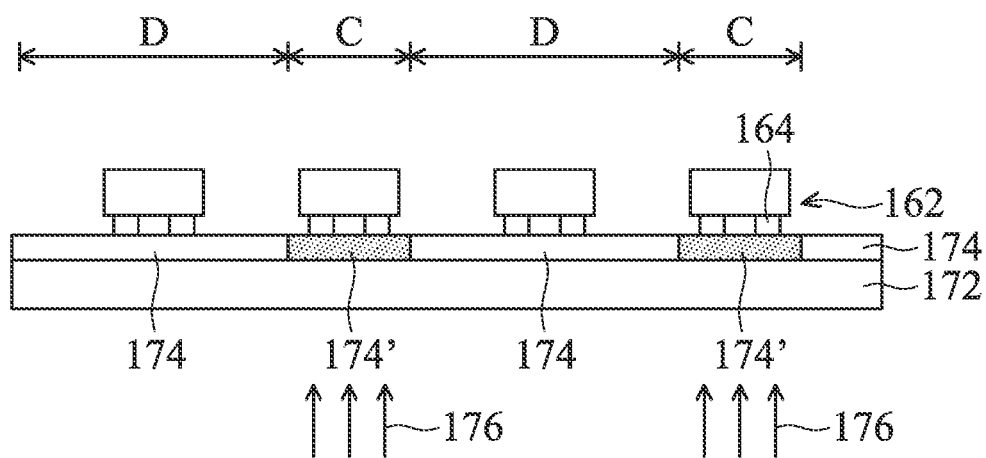

In some embodiments, as shown in FIG. 8F, the light-emitting elements 162 are separated from the substrate 170 shown in FIG. 8E, and the viscosity or adhesion force of a portion of the adhesive layer 174 is reduced. In some embodiments, a heating and/or an illuminating process 176 is performed to a region C of the substrate 172 but not on a region D. As shown in FIG. 8E, the viscosity or adhesion force of the adhesive layer 174 on the region C is reduced because of heating and/or an illuminating, and the adhesive layer 174 on the region C transforms into an adhesive layer 174'. The viscosity or adhesion force of the adhesive layer 174 on the region D is not reduced. In some embodiments, the adhesion force between the adhesive layer 174' and the light-emitting elements 162 is smaller than that between the adhesive layer 174 and the light-emitting elements 162.

Figure 8G:
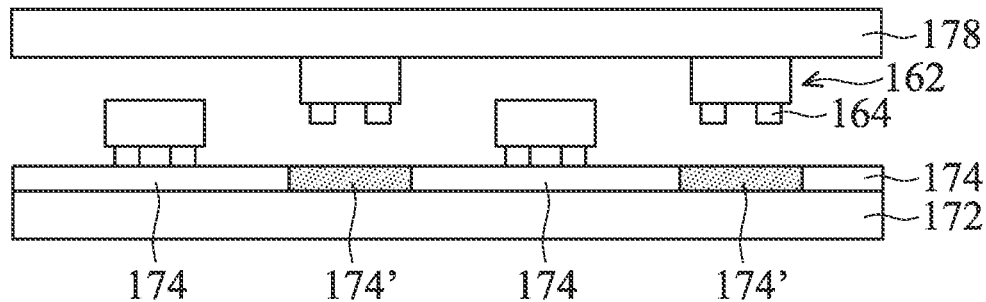

In some embodiments, as shown in FIG. 8G, a portion of the light-emitting elements 162 are transferred to a substrate 178 from the substrate 172. In some embodiments, the substrate 178 has a MEMS device. In some embodiments, since the adhesion force between the adhesive layer 174' and the light-emitting elements 162 is different from that between the adhesive layer 174 and the light-emitting elements 162, the light-emitting elements 162 can be selectively transferred to the substrate 178 from the substrate 172. In some embodiments, the light-emitting elements 162 on the region C are transferred to the substrate 178, and the light-emitting elements 162 on the region D remain on the substrate 172.

In some embodiments, light-emitting elements are transferred to a second substrate from a first substrate by an LLO process. A first adhesive layer is formed on the second substrate to fix the light-emitting elements, and there is a first adhesion force between the light-emitting elements and the first adhesive layer. In some embodiments, the light-emitting elements are transferred to a third substrate from the second substrate. A second adhesive layer is formed on the third substrate, and there is a second adhesion force between the light-emitting elements and the second adhesive layer. In some embodiments, heating and/or illuminating is performed to a portion of the second adhesive layer so that there is a third adhesion force between the portion of the second adhesive layer which is heated or illuminated and the light-emitting elements. The third adhesion force is smaller than the second adhesion force. Next, the light-emitting elements disposed on the portion of the second adhesive layer which is heated or illuminated are transferred to a fourth substrate, and the light-emitting elements disposed on a portion of the second adhesive layer which is not heated or illuminated remain on the third substrate. The light-emitting elements on a substrate are selectively transferred to other substrate by aforementioned process and different adhesion force between each of the adhesive layers.

Figure 9A:
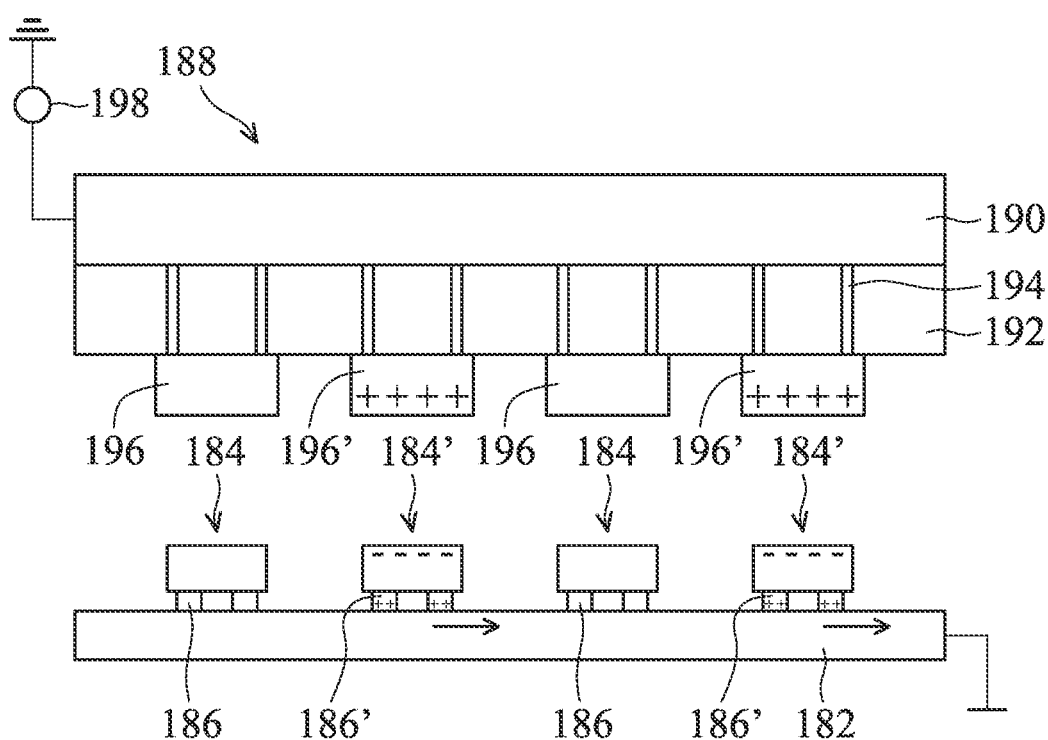
FIGS. 9A-9B are cross-sectional views of two stages of a process for selectively transferring light-emitting elements from one substrate to another in accordance with some embodiments of the present disclosure.
Figure 9B:
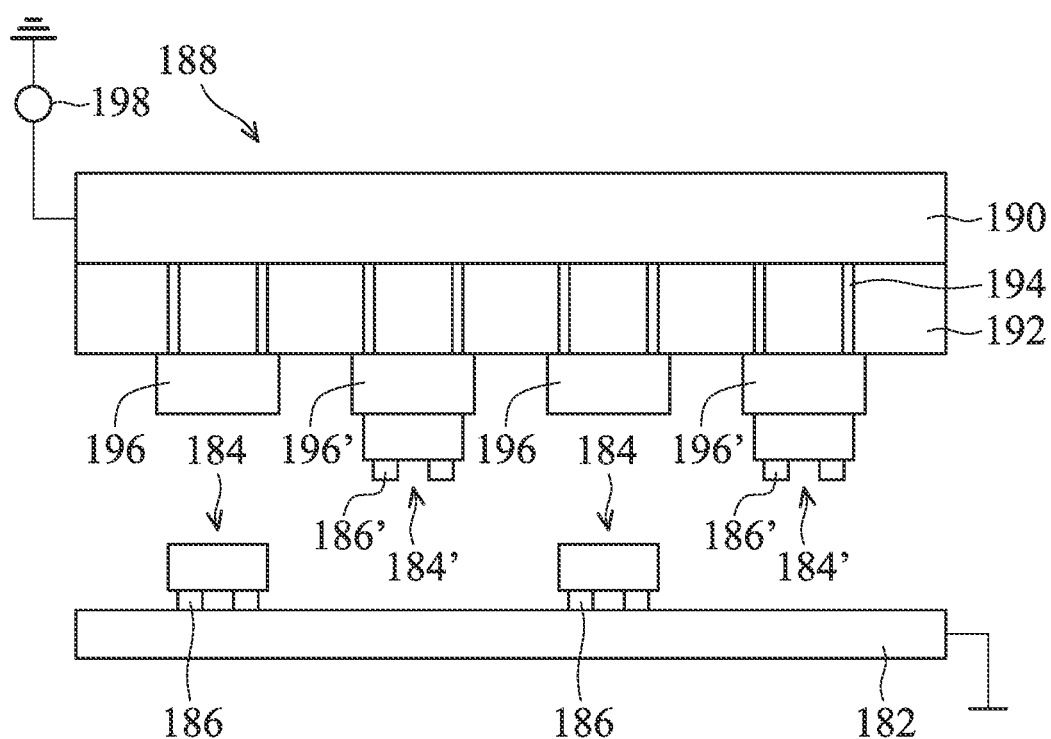

FIGS. 9A and 9B are cross-sectional views of two stages of a process for selectively transferring light-emitting elements from a substrate to another substrate in accordance with some embodiments of the present disclosure. As shown in FIG. 9A, a substrate 182 is provided. In some embodiments, the substrate 182 is a carrier substrate such as the semiconductor substrate 102 shown in FIG. 1. In the subsequent process, the light-emitting elements 184 are removed from the substrate 182. There are conductive bumps 186 on surfaces of the light-emitting elements 184, and the conductive bumps 186 are electrically connected to the substrate 182. In some embodiments, the light-emitting elements 184 and the conductive bumps 186 are the same as or similar to the light-emitting elements 128 and the conductive bumps 130 shown in FIG. 3C, and are not repeated herein.

In some embodiments, the substrate 182 is a conductive substrate. In addition, as shown in FIG. 9, the substrate 182 is grounded. In some embodiments, the light-emitting elements 184 are selectively transferred to a substrate 188 from the substrate 182. In some embodiments, the substrate 188 is configured to dispose transfer heads 196 which are used to pick up the light-emitting elements on the substrate 182, and transfer the light-emitting elements to another substrate. In some embodiments, the substrate 188 includes a MEMS device. As shown in FIG. 9A, the substrate 188 includes a circuit layer 190, an insulating aver 192, conductive vias 194, the transfer heads 196 and the transfer heads 196'. The substrate 182 may have the MEMS device or maybe a conductive controllable film loaded on a substrate. For example, the conductive Controllable film ay be, but is not limited to, a semiconductor, conductive polymer material, a ceramic material doped with conductive particles or a high dielectric constant material.

The circuit layer 190 includes different active or passive elements such as a capacitor or a CMOS transistor. As shown in FIG. 9A, the insulating layer 192 is formed on the circuit layer 190, and the conductive vias 194 penetrate the insulating layer 192. In some embodiments, the insulating layer 192 is made of a dielectric material, and the high dielectric constant material is better. For example, the insulating layer 192 may include, but is not limited to, sapphire, phosphosilicate glass (PSG), borophosphosilicate glass (BPSG), low dielectric constant (low-k) dielectric material and other applicable dielectric materials. The low dielectric constant dielectric materials include, but are not limited to, fluorinated silica glass (FSG), carbon doped silicon oxide, amorphous fluorinated carbon, parylene, bis-benzocyclobutenes (BCB), polyimides, combinations of the above-mentioned materials, and other applicable materials. The conductive vias 194 may include, but is not limited to, copper, aluminum, tungsten, gold, chromium, nickel, platinum, titanium, iridium, rhodium, the above alloys, the above combination or any other applicable materials.

As shown in FIG. 9A, the transfer heads 196 and the transfer heads 196' are disposed on a surface of the insulating layer 192 far from the circuit layer 190. The materials of the transfer heads 196 and the transfer heads 196' are the same as or similar to those of the conductive vias 194. In addition, the transfer heads 196 and the transfer heads 196' are electrically connected to the circuit layer 190 by the conductive vias 194.

As shown in FIG. 9A, the circuit layer 190 is electrically connected to a power source 198. The power source 198 may provide a bias on the substrate 188, and make some of the transfer heads 196 have electric charges on their surfaces. In some embodiments, as shown in FIG. 9A, there are positive charges on surfaces of the transfer head 196', and no electric charge on surfaces of the transfer head 196.

As shown in FIG. 9A, when there are positive electric charges on the surfaces of the transfer head 196', induced charges are generated on surfaces of the corresponding light-emitting elements 184'. In some embodiments, there are negative electric charges on the surfaces of the light-emitting elements 184' adjacent to the transfer head 196', and there is no electric charge on the surfaces of the light-emitting elements 184 adjacent to the transfer head 196. Further, induced electric charges are also generated on surfaces of the conductive bumps 186' far from the light-emitting elements 184'. In some embodiments, there are positive electric charges on the surfaces of the conductive bumps 186' far from the light-emitting elements 184'.

The positive electric charges on the surfaces of the transfer heads 196' attract the negative electric charges on the surfaces of the light-emitting elements 184'. The light-emitting elements 184' can be transferred to the substrate 188 from the substrate 182 by this attraction force. However, the positive electric charges on the surfaces of the transfer heads 196' repel the positive electric charges on the surfaces of the conductive bumps 186', and therefore lead to poor efficiency in the transfer of the light-emitting elements 184' to the substrate 188.

In some embodiments, the substrate 182 is conductive and is grounded. As shown in FIG. 9A, the positive electric charges on the surface of the conductive bumps 186' are removed by the grounded substrate 182. As a result, the repellency force between the surface of the conductive bumps 186' and the surface of the transfer head 196' is eliminated. Therefore, it becomes easy to transfer the light-emitting elements 184' from the substrate to the substrate 188.

Referring to FIG. 9B, the light-emitting elements 184' are transferred to the substrate 188, and the light-emitting elements 184 remain on the substrate 182. In some embodiments, the substrate 188 may be used as the substrate 170 and the substrate 178 shown in FIGS. 8E and 8G, respectively. The substrate 182 may be used as the substrate 166 and the substrate 172 shown in FIGS. 8B and 8E, respectively.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for manufacturing a semiconductor device, comprising:

forming a plurality of diodes on a first substrate;
forming a first pattern array on a second substrate;
transferring the plurality of diodes from the first substrate to the second substrate;
forming the first pattern array on a third substrate;
transferring the plurality of diodes from the second substrate to the third substrate;
forming a second pattern array on a fourth substrate; and
transferring the plurality of diodes from the third substrate to the fourth substrate,
wherein during transferring the plurality of diodes from the third substrate to the fourth substrate, spacer layers on the third substrate are aligned with plurality of spacer layers on the fourth substrate and plurality of non-aligned spacer layers on the fourth substrate are in between aligned plurality of spacer layers on the fourth substrate and at least one of the plurality of diodes is transferred between plurality of non-aligned spacer layers on the fourth substrate,
wherein a pitch between the plurality of diodes on the first substrate is different from a pitch of the first pattern array.

2. The method as claimed in claim 1, wherein the pitch of the first pattern array is n times larger than a pitch of the second pattern array, and wherein n is a positive integer.

3. The method as claimed in claim 1, wherein the first pattern array comprises an adhesive layer.

4. The method as claimed in claim 1, wherein a material of the second substrate is conductive.

5. The method as claimed in claim 1, wherein a material of the third substrate is conductive.

* * * * *